US006586113B1

(12) United States Patent
Bahl et al.

(10) Patent No.: US 6,586,113 B1
(45) Date of Patent: Jul. 1, 2003

(54) ETCHING HETEROJUNCTION INTERFACES

(75) Inventors: Sandeep R. Bahl, Palo Alto, CA (US); Yu-Min Houng, Cupertino, CA (US); Virginia M. Robbins, Los Gatos, CA (US); Fred Sugihwo, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 103 days.

(21) Appl. No.: 09/619,418

(22) Filed: Jul. 19, 2000

(51) Int. Cl.[7] .................................................. B32B 9/00
(52) U.S. Cl. ....................... 428/620; 428/642; 428/699; 428/704; 257/200
(58) Field of Search ................................ 428/621, 642, 428/689, 699, 704, 212; 257/192, 194, 195, 197, 198, 200, 201

(56) References Cited

U.S. PATENT DOCUMENTS

| 4,908,325 A | | 3/1990 | Berenz |
| 5,569,944 A | | 10/1996 | Delaney et al. |
| 5,682,046 A | * | 10/1997 | Takahashi .................... 257/198 |

OTHER PUBLICATIONS

F. Ren et al., "Self–Aligned InGaP/GaAs Heterojunction Bipolar Transistors for Microwave Power Application," IEEE Electron Device Letters, vol. 14, No. 7, Jul. 1993.
A. Y. Lew et al., "Characterization of arsenide/phosphide heterostructure interfaces grown by gas–source molecular beam epitaxy," Appl. Phys. Lett., vol. 67, No. 7, Aug. 14, 1995.
C.H. Yan, "P2–Induced P/As exchange on GaAs during gas–source molecular beam epitaxy growth interruptions," Journal of Crystal Growth, vol. 164, 1996. No Month.
J.R. Lothian et al., "Plasma and Wet Chemical Etching of In(0.5)Ga(0.5)P," Journal of Electronic Materials, vol. 21, No. 4, 1992. No Month.
O. Schuler et al., "Interface quality and electron transfer in the GaInP on GaAs heterojunction," J. Appl. Phys., vol. 84, No. 2, Jul. 15, 1998.
Gerhard Franz, "Robust Reactive Ion Etching Processes for GaAs/AlGaAs/AlAs by Application of Statistical Concepts," J. Elctrochem. Soc., vol. 140, No. 4, Apr. 1993.
S.F. Yoon, "0.25–micron gate In (0.48)Ga(0.52)P/In(0.2)Ga(0.8)As/GaAs pseudomorphic high electron mobility transistors grown by solid–source molecular beam epitaxy," Solid–State Electronics, vol. 43, 1999. No Month.

* cited by examiner

Primary Examiner—Deborah Jones
Assistant Examiner—Arden Sperty

(57) ABSTRACT

Systems and methods of manufacturing etchable heterojunction interfaces and etched heterojunction structures are described. A bottom layer is deposited on a substrate, a transition etch layer is deposited over the bottom layer, and a top layer is deposited over the transition etch layer. The transition etch layer substantially prevents the bottom layer and the top layer from forming a material characterized by a composition substantially different than the bottom layer and a substantially non-selective etchability with respect to the bottom layer. By tailoring the structure of the heterojunction interface to respond to heterojunction etching processes with greater predictability and control, the transition etch layer enhances the robustness of previously unreliable heterojunction device manufacturing processes. The transition etch layer enables one or more vias to be etched down to the top surface of the bottom layer in a reliable and repeatable manner. In particular, because the transition etch layer enables use of an etchant that is substantially selective with respect to the bottom layer, the thickness of critical device layers may be determined by the precise epitaxial growth processes used to form the bottom layer rather than relatively imprecise non-selective etch processes.

22 Claims, 2 Drawing Sheets

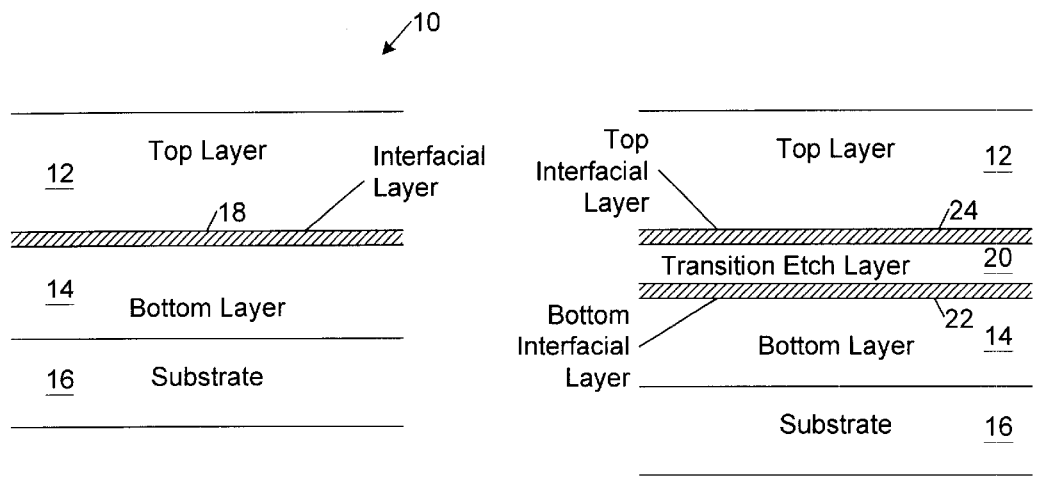
FIG. 1 (Prior Art)
FIG. 2
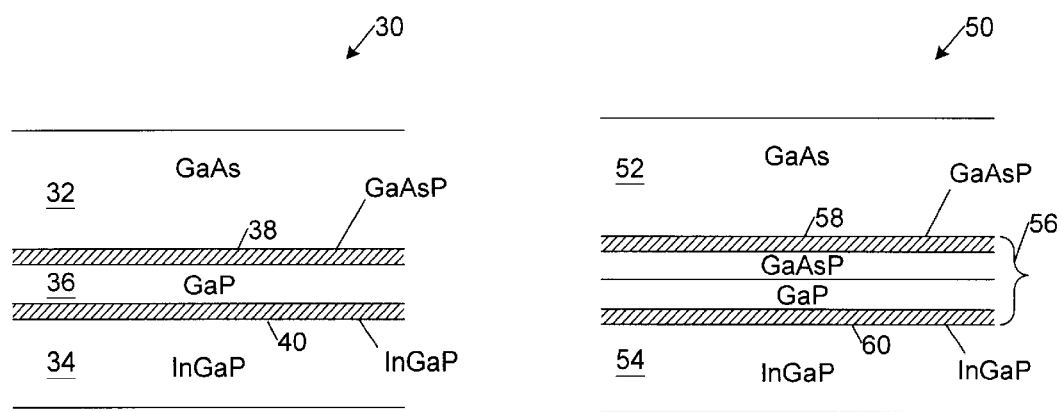
FIG. 3
FIG. 4

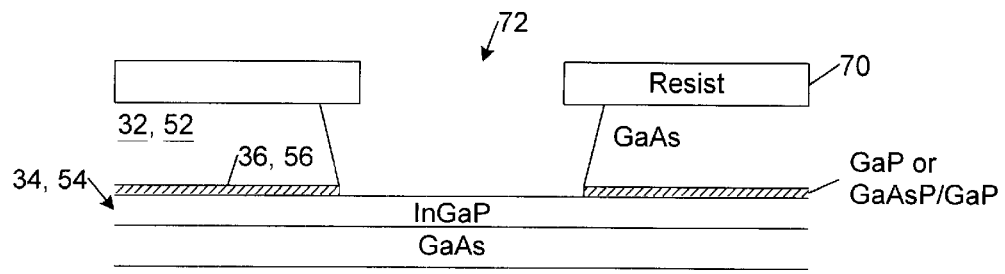
FIG. 5A
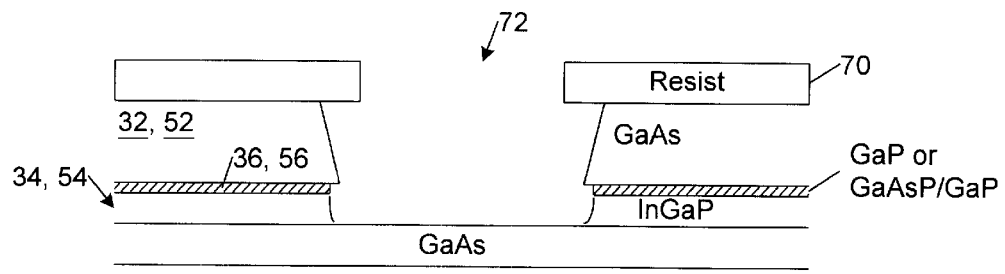
FIG. 5B
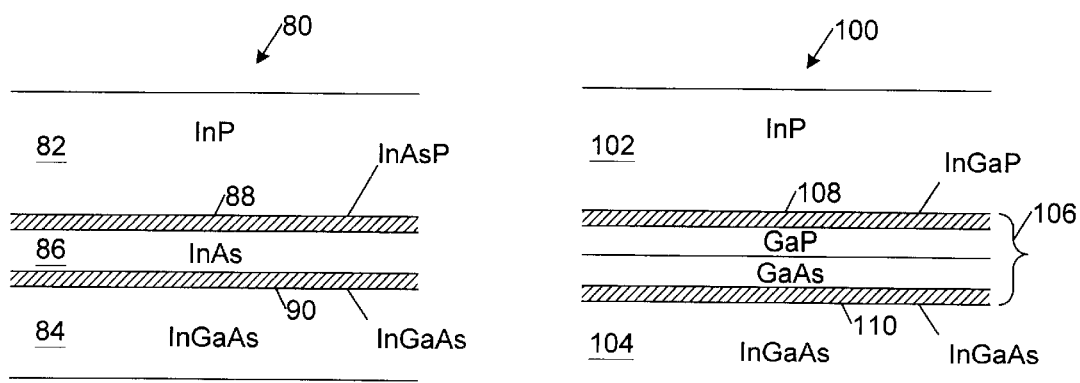
FIG. 6
FIG. 7

ETCHING HETEROJUNCTION INTERFACES

TECHNICAL FIELD

This invention relates to systems and methods of manufacturing etchable heterojunction interfaces, and further relates to etched heterojunction structures.

BACKGROUND

A heterojunction (or heterostructure) is a junction formed between two adjacent dissimilar materials (e.g., two different semiconductor materials). Over the years, many devices have been proposed that exploit the unique properties and features of heterojunctions, properties that are not readily available from devices formed from a single material structure (e.g., homojunctions).

Typically, a heterojunction includes an interfacial parasitic layer (or heterojunction interface) that is composed of some or all of the constituent elements of the two adjacent materials forming the heterojunction. In many semiconductor heterojunction devices, it is necessary to etch through the heterojunction interface. Heterojunction interfaces must be etched, for example, to define active device layers (e.g., an emitter mesa in a heterojunction bipolar transistor) or to tune device parameters (e.g., the breakdown voltage and the threshold voltage of a heterojunction field effect transistor). For example, in the base contact region of a gallium arsenide/indium gallium phosphide (GaAs/InGaP) heterojunction bipolar transistor, the GaAs layer usually is removed with a selective etchant that stops at the InGaP layer. The InGaP layer subsequently is removed with a different selective etchant that preferably stops at the GaAs base. This process prevents the GaAs base from being over-etched. Similarly, in the gate recess region of a GaAs/InGaP field effect transistor, the GaAs cap usually is removed with a selective etchant that preferably stops at the InGaP layer. The InGaP layer subsequently is thinned with an etchant that etches through the InGaP layer at a relatively slow and predictable rate to set the threshold voltage of the field effect transistor.

To improve the speed and performance of semiconductor devices, there has been a constant push toward reducing devices sizes. As device dimensions shrink, however, the device elements, such as contacts, plugs, vias, and interconnect lines, also must shrink proportionately. In the current generation of semiconductor devices, circuit density has become so compact that device features have decreased below submicron dimensions. As device features shrink, it becomes more important to control critical device dimensions. Unfortunately, as device dimensions become smaller and spaced relatively closer together (e.g., less than 0.5 micron and even less than 0.25 micron), device manufacturing processes become less reliable, and device performance and processing yield tend to degrade significantly.

In order to control critical device dimensions, semiconductor device manufacturing processes typically rely on a high etch selectivity and a high aspect ratio between adjacent device layers. The selectivity of an etch process is the ratio of the etch rates of different materials. The aspect ratio of an etch process is the depth that the etch process can achieve while maintaining the requisite critical lateral dimensions. Generally, semiconductor device processing techniques have the ability to control the critical dimensions within acceptable tolerance ranges for devices with dimensions in the range of approximately 0.5–1.0 micron. However, as the dimensions decrease below this level, and especially at or below 0.25 micron, these processes often do not provide sufficient control over the critical dimensions due to poor etch selectivity and low aspect ratios.

SUMMARY

Prior device manufacturing efforts have focused on various parameters of device etching processes (e.g., etchant composition, etchant concentration, and etchant temperature) to control the dimensions and other physical properties of the devices being manufactured. The invention provides improved results by tailoring the structure of the heterojunction interface to respond to heterojunction etching processes with greater predictability and control.

In one aspect, the invention features a processing method in which a bottom layer is deposited on a substrate, a transition etch layer is deposited over the bottom layer, and a top layer is deposited over the transition etch layer. The transition etch layer substantially prevents the bottom layer and the top layer from forming a material characterized by a composition substantially different than the bottom layer and a substantially non-selective etchability with respect to the bottom layer.

As used herein, the "substantially non-selective etchability" of a first layer with respect to a second layer refers to the inability to etch the first layer with an etchant that is substantially selective with respect to the second layer. Similarly, the "substantially selective etchability" of a first layer with respect to a second layer refers to the ability to etch the first layer with an etchant that is substantially selective with respect to the second layer.

Embodiments of the invention may include one or more of the following features.

In some embodiments, the transition etch layer substantially prevents the bottom layer and the top layer from forming a material characterized by a composition substantially different than the top layer and a substantially non-selective etchability with respect to the top layer. The transition etch layer may be characterized by a substantially non-selective etchability with respect to the top layer. The transition etch layer may form with the top layer a top interfacial layer that is characterized by a substantially non-selective etchability with respect to the top layer. The transition etch layer may include two or more sub-layers.

In some embodiments, the top layer and the bottom layer are different compound semiconductors each formed from a respective combination of constituent elements, and the transition etch layer is a compound semiconductor formed from a combination of two or more but less than all of the constituent elements of the top layer and the bottom layer. In one embodiment, one of the top layer and the bottom layer is GaAs, the other of the top layer and the bottom layer is InGaP, and the transition etch layer is formed from GaP or a combination of GaP and GaAsP. In another embodiment, one of the top layer and the bottom layer is InGaAs, the other of the top layer and the bottom layer is InP, and the transition etch layer is formed from InAs or a combination of GaP and GaAs.

The transition etch layer preferably has a thickness that is less than about 10 nanometer (nm), and more preferably has a thickness between about 0.5 nm and about 5 nm.

In some embodiments, the top layer is etched with an etchant, and the transition etch layer preferably is etched with the same etchant. In one embodiment, a top interfacial layer formed between the top layer and the transition etch layer also may be etched with the same etchant with which the top layer was etched. In another embodiment, a bottom interfacial layer formed between the bottom layer and the transition etch layer also may be substantially etched with the same etchant with which the top layer was etched. In some embodiments, the transition etch layer is etched with an etchant that is selective to the bottom layer and different from the etchants used to etch the top layer and the bottom layer.

In another aspect, the invention features a composition of matter comprising a top layer, a bottom layer, and a transition etch layer disposed between the top layer and the bottom layer. The transition etch layer substantially prevents the bottom layer and the top layer from forming a material characterized by a composition substantially different than the bottom layer and a substantially non-selective etchability with respect to the bottom layer.

In another aspect, the invention features a composition of matter comprising a first layer of GaAs, a second layer of InGaP, a transition etch layer disposed between the first layer and the second layer, and a via. The via is etched through the transition etch layer, one of the first layer and the second layer, and at least a portion of the other of the first layer and the second layer. The transition etch layer has a thickness less than about 10 nm and is formed from GaP or a combination of GaP and GaAsP.

As used herein, the term "via" refers to any region of a composition of matter in which one or more material layers have been removed (e.g., to form a window, opening, hole, or trench).

Among the advantages of the invention are the following.

By tailoring the structure of the heterojunction interface to respond to heterojunction etching processes with greater predictability and control, the invention enhances the robustness of previously unreliable heterojunction device manufacturing processes. The inventive transition etch layer enables one or more vias to be etched down to the top surface of the bottom layer in a reliable and repeatable manner. In particular, because the transition etch layer enables use of an etchant that is substantially selective with respect to the bottom layer, the thickness of critical device layers may be determined by the precise epitaxial growth processes used to form the bottom layer rather than relatively imprecise non-selective etch processes.

Other features and advantages of the invention will become apparent from the following description, including the drawings and the claims.

DESCRIPTION OF DRAWINGS

FIG. 1 is a diagrammatic view of a composition of matter that includes a top layer and a bottom layer and a parasitic interfacial layer characterized by a different composition than the bottom layer and a substantially non-selective etchability with respect to the bottom layer.

FIG. 2 is a diagrammatic view of a composition of matter that includes a transition etch layer disposed between the top layer and the bottom layer that substantially prevents the top layer and the bottom layer from forming a material with the etchability characteristics of the parasitic interfacial layer of FIG. 1.

FIG. 3 is a diagrammatic view of a GaAs/InGaP heterojunction with a GaP transition etch layer.

FIG. 4 is a diagrammatic view of a GaAs/InGaP heterojunction with a GaAsP/GaP transition etch layer.

FIG. 5A is a diagrammatic view of a GaAs/InGaP heterojunction in which the GaAs layer and the transition etch layer have been removed in a base contact region of a heterojunction bipolar transistor.

FIG. 5B is a diagrammatic view of the GaAs/InGaP heterojunction of FIG. 5A in which the InGaP layer has been removed in the base contact region of the heterojunction bipolar transistor.

FIG. 6 is a diagrammatic view of an InP/InGaAs heterojunction with an InAs transition etch layer.

FIG. 7 is a diagrammatic view of an InP/InGaAs heterojunction with a GaP/GaAs transition etch layer.

DETAILED DESCRIPTION

Referring to FIG. 1, a heterojunction 10 is formed from a top layer 12 that is disposed over a bottom layer 14, which, in turn, is disposed over a substrate 16. Substrate 16 may be formed from any suitable substrate material (e.g., a semiconductor substrate, such as silicon and GaAs, or other substrate, such as quartz, or a substrate supporting one or more additional material layers). Top layer 12 and bottom layer 14 may be formed from any one of many different film deposition processes, including physical methods (e.g., sputtering and ion beam deposition processes), chemical methods (e.g., chemical vapor deposition processes) and physical-chemical methods (plasma and glow discharge processes). In addition, top layer 12 and bottom layer 14 each may include a single layer, or two or more constituent sub-layers. Indeed, heterojunction 10 may have any composition designed to utilize the inherent properties (e.g., electrical properties, magnetic properties or optical properties) of the interface between top layer 12 and bottom layer 14. As explained above, to exploit such properties in the form a device, heterojunction 10 typically must be processed (i.e., etched) to expose bottom layer 14 or substrate 16, or both, for electrical connection to other devices.

Process control and repeatability for a system such as heterojunction 10, however, may be impaired by a parasitic interfacial layer 18 that typically forms between top layer 12 and bottom layer 14. Interfacial layer 18 may form as a result of finite switching transients in the growth system, background concentrations of previously grown layer constituents, or migration of layer constituents from one layer to another. Interfacial layer 18 may impair process control because the composition and thickness of interfacial layer 18 may vary from run-to-run and may vary from one surface region of substrate 16 to another. In addition, etch processes that are selective with respect to top layer 12 and bottom layer 14 may not etch predictably through interfacial layer 18, which may contain a mixture of all of the constituent elements of top layer 12 and bottom layer 14. For example, interfacial layer 18 may be characterized by a different composition than bottom layer 14 and a substantially non-selective etchability with respect to bottom layer 14. In this case, interfacial layer 18 inhibits the ability to controllably etch through top layer 12 to the top surface of bottom layer 14. These characteristics of interfacial layer 18 tend to reduce the reliability and reproducibility of any device fabrication process.

Referring to FIG. 2, in one embodiment, the structure of the heterojunction interface is tailored to respond to heterojunction etching processes with greater predictability and control. In particular, a transition etch layer 20 is disposed between top layer 12 and bottom layer 14 to prevent formation of a material composition with the undesirable etching characteristics of interfacial layer 18 (see FIG. 1). Transition etch layer 20 prevents top layer 12 and bottom layer 14 from intermixing and forms with bottom layer 14 a bottom interfacial layer 22 that is either substantially the same composition as bottom layer 14 or is characterized by a substantially selective etchability with respect to bottom layer 14. Often, it is also desirable for transition etch layer 20, as well as forming a top interfacial layer 24 with top layer 12, to have a substantially selective etchability with respect to bottom layer 14. At the same time, transition etch layer 20 preferably only minimally affects the operational device characteristics of the heterojunction interface, if at all.

The features of transition etch layer 20 enable one or more vias to be etched down to the top surface of bottom layer 14 in a reliable and repeatable manner. In particular, because transition etch layer 20 enables use of an etchant that is substantially selective with respect to bottom layer 14, the thickness of critical device layers may be determined by the precise epitaxial growth processes used to form bottom layer 14 rather than relatively imprecise non-selective etch processes.

In the following exemplary embodiments, transition etch layer 20 is formed from a combination of two or more but less than all of the constituent elements of top layer 12 and bottom layer 14.

EXAMPLE 1

Referring to FIG. 3, in one embodiment that may be incorporated into a heterojunction bipolar transistor (HBT) device structure, a GaAs/InGaP heterojunction 30 includes a GaAs top layer 32, an InGaP bottom layer 34, and a GaP transition etch layer 36. The GaP transition etch layer 36 forms with top layer 32 a GaAsP top parasitic interfacial layer 38 and forms with bottom layer 34 an InGaP bottom parasitic interfacial layer 40. The GaAs top layer 32, the GaAsP top interfacial layer 38, and the GaP transition etch layer 36 all may be etched by any one of various conventional chlorine-based dry etches. Bottom interfacial layer 40 and bottom layer 34 have substantially the same chemical composition (i.e., InGaP), and both layers may be removed by a conventional hydrochloric acid-based wet etchant.

The presence of one or more monolayers of the GaP transition etch layer 36 prevents the formation of an InGaAsP parasitic interfacial layer between the GaAs top layer 32 and the InGaP bottom layer 34. Such a parasitic interfacial layer is undesirable in the heterojunction structure of FIG. 3 because InGaAsP includes all of the constituent elements of the InGaP bottom layer 34, in which case it is not possible to etch selectively through such a parasitic interfacial layer down to the top surface of the InGaP bottom layer 34.

EXAMPLE 2

Referring to FIG. 4, in another embodiment that may be incorporated into a HBT device structure, a GaAs/InGaP heterojunction 50 includes a GaAs top layer 52, an InGaP bottom layer 54, and a multilayer GaAsP/GaP transition etch layer 56. The GaAsP/GaP transition etch layer 56 forms with top layer 52 a GaAsP top parasitic interfacial layer 58 and forms with bottom layer 54 an InGaP bottom parasitic interfacial layer 60. The GaAs top layer 52, the GaAsP top interfacial layer 58, and the GaAsP/GaP transition etch layer 56 all may be etched by any one of various conventional chlorine-based dry etches. Bottom interfacial layer 60 and bottom layer 54 have substantially the same chemical composition (i.e., InGaP), and both layers may be removed by a hydrochloric acid-based wet etchant.

The growth of a GaAsP layer over the GaP layer in transition etch layer 56 allows transition etch layer 56 to be grown with a thickness that is greater than several monolayers without any strain-induced dislocations or other defects associated with lattice-mismatches between the GaP portion of transition etch layer 56 and the underlying InGaP bottom layer 54. In some embodiments, the GaAsP layer is graded in composition from the GaAs top layer to the GaP layer. In particular, the transition etch layer may be formed from $GaAs_xP_{1-x}$, where x varies from about 1 to about 0 from the GaAs top layer to the GaP portion of transition etch layer 56. The resulting graded transition layer may improve the properties of devices that incorporate such a GaAs/InGaP heterojunction.

EXAMPLE 3

Referring to FIGS. 5A and 5B, the heterojunction structures of Example 1 and Example 2 may be processed as follows (e.g., to open a window in the HBT structure for base contact metallization). A resist layer 70 may be deposited over the. GaAs top layer 32, 52 and patterned to define a base contact window region 72. The GaAs top layer 32, 52 and transition layer 36, 56, as well as any interfacial layers formed from transition layer 36, 56, may be removed by any conventional chlorine-base dry etches, which selectively etch the overlying layers and stop at the bottom InGaP layer 34, 54. The bottom InGaP layer subsequently may be removed by a conventional hydrochloric acid-based wet etchant.

EXAMPLE 4

In another embodiment that may be incorporated into a high electron mobility transistor (HEMT) device structure, a GaAs/InGaP heterojunction includes a GaAs top layer, an InGaP bottom layer, and a GaP transition etch layer or a multilayer GaAsP/GaP transition etch layer. The GaAs top layer may be etched selectively by a wet (ammonia:peroxide)-based etchant, which stops at the underlying GaAsP interfacial layer formed between the top layer and the transition etch layer. The GaAsP top interfacial layer and the transition etch layer both may be etched by any one of various conventional hydrochloric acid-based cleanup etchants. The bottom interfacial layer and the bottom layer have substantially the same chemical composition (i.e., InGaP), and both layers may be thinned to a desired thickness by a conventional wet etchant that is selected to etch InGaP at a relatively slow rate.

EXAMPLE 5

Referring to FIG. 6, in one embodiment that may be incorporated into a heterojunction bipolar transistor (HBT) device structure or a laser device structure, an InP/InGaAs heterojunction 80 includes an InP top layer 82, an InGaAs bottom layer 84, and an InAs transition etch layer 86. The InAs transition etch layer 86 forms with top layer 82 an InAsP top parasitic interfacial layer 88 and forms with bottom layer 84 an InGaAs bottom parasitic interfacial layer 90. The InP top layer 82 and the InAsP top interfacial layer 88 both may be etched by any one of various conventional hydrochloric acid-based wet etchants. The InAs transition etch layer 86, the InGaAs bottom interfacial layer 90 and the InGaAs bottom layer 84 all may be removed by a (phosphoric:peroxide)-based wet etchant.

EXAMPLE 6

Referring to FIG. 7, in another embodiment that may be incorporated into a HBT device structure, an InP/InGaAs heterojunction 100 includes an InP top layer 102, an InGaAs bottom layer 104, and GaP/GaAs transition etch layer 106. The GaP/GaAs transition etch layer 106 forms with top layer 102 an InGaP top parasitic interfacial layer 108 and forms with bottom layer 104 an InGaAs bottom parasitic interfacial layer 110. The InP top layer 102, the InGaP top interfacial layer 108, the GaP portion of transition etch layer 106, and the GaAsP parasitic interfacial layer formed between the layers of transition etch layer 106 all may be etched by any one of various conventional hydrochloric acid-based wet etchants. The GaAs portion of transition etch layer 106, the InGaAs bottom interfacial layer 110 and the InGaAs bottom layer 104 all may be removed by a (phosphoric:peroxide)-based wet etchant.

The thickness of any of the various transition etch layers described above may vary depending upon the particular device structures being manufactured and the composition of the particular heterojunction layers surrounding the transition etch layer. In general, the transition etch layer preferably has a thickness that is less than about 10 nm, and more preferably has a thickness between about 0.5 nm and about 5 nm. Lattice-matching issues and device performance issues (e.g., bandgap matching issues) also should inform the selection of the properties of the transition etch layer.

Other embodiments are within the scope of the claims. For example, transition etch layers with the properties and characteristics described above may be advantageously incorporated into heterojunctions formed from compound semiconductors that are different than the compound semiconductors described in connection with the exemplary embodiments of Examples 1–6. Indeed, transition etch layers of the invention may be incorporated into heterojunctions formed from any two material layers (e.g., any III–IV or II–VI compound semiconductor layers, or any non-semiconductor material layers) between which is formed a parasitic interfacial layer characterized by a substantially different composition than the bottom layer and a substantially non-selective etchability with respect to the bottom layer.

Still other embodiments are within the scope of the claims.

What is claimed is:

1. A composition of matter, comprising:
    a top layer having a top layer composition;
    a bottom layer having a bottom layer composition and a tendency to cooperatively form with the top layer a parasitic interface material having a composition substantially different than the bottom layer and a substantially non-selective etchability with respect to the bottom layer;
    a transition etch layer disposed between the top layer and the bottom layer and substantially preventing the bottom layer and the top layer from intermixing and forming the parasitic interface material, the transition etch layer having a thickness between about 0.5 nm and about 5 nm and forming with the bottom layer a bottom parasitic interface layer characterized by a composition substantially similar to the bottom layer composition or a substantially selective etchability with respect to the bottom layer; and
    a via etched through the top layer, the transition etch layer, and at least a portion of the bottom layer;
    wherein the top layer and the bottom layer are different compound semiconductors each formed from a respective combination of constituent elements, and the transition etch layer is a compound semiconductor formed from a combination of two or more but less than all of the constituent elements of the top layer and the bottom layer.

2. The composition of matter of claim 1, wherein the transition etch layer is characterized by a substantially selective etchability with respect to the bottom layer.

3. The composition of matter of claim 1, wherein the transition etch layer is characterized by a substantially non-selective etchability with respect to the top layer.

4. The composition of matter of claim 1, wherein one of the top layer and the bottom layer is GaAs, the other of the top layer and the bottom layer is InGaP, and the transition etch layer is formed from GaP or a combination of GaP and GaAsP.

5. The composition of matter of claim 1, wherein the transition etch layer is graded in composition from the top layer to the bottom layer.

6. The composition of matter of claim 1, wherein the transition etch layer includes two or more sub-layers.

7. The composition of matter of claim 1, wherein the top layer and the transition etch layer are etchable by a common etchant.

8. The composition of matter of claim 1, wherein the via corresponds to a window of a semiconductor transistor.

9. A composition of matter, comprising:
    a first layer of InP;
    a second layer of InGaAs; and
    a transition etch layer disposed between the first layer and the second layer and formed from InAs or a combination of GaP and GaAs.

10. The composition of matter of claim 9, wherein the transition etch layer is formed from a GaP layer disposed adjacent to the InP layer and a GaAs layer disposed adjacent to the InGaAs layer.

11. The composition of matter of claim 9, wherein the transition etch layer is formed from a InAs.

12. The composition of matter of claim 9, wherein the transition etch layer has a thickness of about 0.5 nm to about 5 nm.

13. The composition of matter of claim 9, further comprising a via etched through the transition etch layer, one of the first layer and the second layer, and at least a portion of the other of the first layer and the second layer.

14. The composition of matter of claim 9, further comprising a via corresponding to a window of a semiconductor transistor and etched through the top layer, the transition etch layer, and at least a portion of the bottom layer.

15. A composition of matter comprising:
    a first layer of GaAs;
    a second layer of InGaP;
    a transition etch layer disposed between the first layer and the second layer, having a thickness between about 0.5 nm and about 5 nm and formed from GaP; and
    a via etched through the transition etch layer, one of the first layer and the second layer, and at least a portion of the other of the first layer and the second layer.

16. The composition of matter of claim 15, wherein the transition etch layer is formed from a GaP layer disposed adjacent to the InGaP layer and a GaAsP layer disposed adjacent to the GaAs layer.

17. The composition of matter of claim 15, wherein the via corresponds to a window of a semiconductor transistor.

18. A composition of matter comprising:
    a first layer of GaAs;
    a second layer of InGaP;

a transition etch layer disposed between the first layer and the second layer formed from a combination of GaP and GaAsP; and a via etched through the transition etch layer, one of the first layer and the second layer, and at least a portion of the other of the first layer and the second layer.

19. The composition of matter of claim 18, wherein the transition etch layer has a thickness of about 0.5 nm to about 5 nm.

20. The composition of matter of claim 18, wherein the transition etch layer is formed from a GaP layer disposed adjacent to the InGaP layer and a GaAsP layer disposed adjacent to the GaAs layer.

21. The composition of matter of claim 18, further comprising a via etched through the transition etch layer, one of the first layer and the second layer, and at least a portion of the other of the first layer and the second layer.

22. The composition of matter of claim 18, wherein the via corresponds to a window of a semiconductor transistor.

* * * * *